United States Patent [19]

Goldstein et al.

[11] Patent Number: 5,215,939
[45] Date of Patent: Jun. 1, 1993

[54] METHOD OF MANUFACTURING A PLANAR BURIED HETEROJUNCTION LASER

[75] Inventors: Léon Goldstein, Chaville; Dominique Bonnevie, Leuville sur Orge; François Brillouet, Sevres; Francis Poingt, Sainte Genevieve des Bois; Jean-Louis Lievin, Paris, all of France

[73] Assignee: Alcatel N.V., Amsterdam, Netherlands

[21] Appl. No.: 832,024

[22] Filed: Feb. 6, 1992

[30] Foreign Application Priority Data

Feb. 8, 1991 [FR] France ................. 91 01470

[51] Int. Cl.$^5$ ............................. H01L 21/20
[52] U.S. Cl. ......................... 437/129; 437/944; 148/DIG. 90; 148/DIG. 100
[58] Field of Search ........... 437/129, 127, 133, 944; 148/DIG. 95, DIG. 100

[56] References Cited

U.S. PATENT DOCUMENTS

| | | |
|---|---|---|
| 4,692,206 | 9/1987 | Kaneiwa . |
| 4,799,227 | 1/1989 | Kaneiwa . |
| 4,984,244 | 1/1991 | Yamamoto . |
| 5,084,409 | 1/1992 | Beam, III et al. ........ 148/DIG. 100 |
| 5,128,276 | 7/1992 | Ambrosius et al. ................. 437/129 |

FOREIGN PATENT DOCUMENTS

| | | |
|---|---|---|
| 0192450 | 8/1986 | European Pat. Off. . |
| 0359542 | 3/1990 | European Pat. Off. . |
| 62-00857 | 7/1988 | Japan . |
| 81441 | 3/1990 | Japan ................. 437/944 |

OTHER PUBLICATIONS

H. Ishiguro, et al., "Very low threshold planar buried heterostructure . . . ", Applied Physics Letters, vol. 51, No. 12, 21 Sep. 1987, pp. 874–876.

*Primary Examiner*—Brian E. Hearn
*Assistant Examiner*—Linda J. Fleck
*Attorney, Agent, or Firm*—Brunell & May

[57] ABSTRACT

In a method of manufacturing a planar buried heterojunction laser, after etching to delimit a laser stripe in relief on a substrate, lateral layers to surround the stripe are formed by a non-selective growth method not only at the sides of the stripe but also above it to create a parasitic projection. This projection is then removed after separation from the substrate by selective attack of a lift-off stripe which was deposited for this purpose above the stripe prior to this etching. Passages are formed for the attack medium used for this purpose. The invention can be applied in particular to the manufacture of fiber optic transmission systems.

6 Claims, 1 Drawing Sheet

METHOD OF MANUFACTURING A PLANAR BURIED HETEROJUNCTION LASER

BACKGROUND OF THE INVENTION

1. Field of the invention

The present invention concerns a buried stripe semiconductor laser. The semiconductor structure of a laser of this kind is known internationally as a "planar buried heterojunction" (PBH) structure.

2. Description of the Prior Art

Prior art methods of manufacturing a PBH laser include so-called layer growing steps during which the semiconductor layer thickness is increased by epitaxial deposition of the material of the layers. This process is briefly as follows:

- Growth of binary composition, then quaternary composition and then binary composition semiconductor layers on a substrate. This produces a double heterostructure.
- Definition of a laser stripe in the quaternary composition layer by chemical etching from the top surface of the substrate using a dielectric mask.
- Growth of two lateral semiconductor layers to surround and bury the laser stripe.

This lateral layer growth step can employ so-called "selective" growth methods which have various drawbacks including a limited yield. Alternatively, it can employ a non-selective growth method which grows the semiconductor material not only on the sides of the laser stripe but also above the latter to create a parasitic projection. In this case it is known to grow a lift-off or stencil layer before the laser stripe is defined, the part of this lift-off layer remaining under the parasitic projection being subsequently selectively chemically attacked to separate and remove the projection. A method of this kind is described in PATENT ABSTRACTS OF JAPAN, vol. 12, No. 449 (E-686), 25 Nov. 1988 and in JP-A-63 177 493 (NIPPON TELEGR. & TELEPH. CORP. NTT) dated 21 Jul. 1988. Its efficacy seems aleatoric.

The objects of the present invention are:
- to increase the efficacy of a method of manufacturing a planar buried heterojunction laser,
- to enable the use in this method of high-yield non-selective growth methods, and
- to enable the use in this method of techniques which have advantages over the techniques previously employed.

SUMMARY OF THE INVENTION

The present invention consists in a method of manufacturing a planar buried heterojunction laser including a stage in which is formed a lower confinement layer consisting of a semiconductor base material having a first type of conductivity,
- the method comprising subsequent other steps including layer growing steps for epitaxial deposition of semiconductor layers on underlying layers, said other steps including:
 - growth of an active layer of an active material,
 - growth of a first upper confinement layer of said base material having the second type of conductivity,
 - growth of a lift-off layer of a lift-off material that can be selectively attacked by chemical means,
 - growth of a protective layer on said lift-off layer whereby subsequent laser stripe boundary definition etching eliminates said protection layer at both sides of said laser stripe while allowing it to remain above said stripe in the form of a protective stripe for forming said mesa above said stripe,
 - etching to define the boundaries of said laser stripe by locally eliminating at least said active layer, said first upper confinement layer and said lift-off layer by etching two valleys one on each side of an upstanding mesa joined by two flanks to said valleys, said mesa comprising a laser stripe, an upper confinement layer and a lift-off layer consisting of the remaining portions of said active layer, said first upper confinement layer and said lift-off layer, respectively,
 - a sub-etching step carried out using a lift-off attacking medium to eliminate two lateral zones of said lift-off stripe and form a hollow under each edge of said parasitic projection whereby a subsequent lateral layer growth step causes the appearance of two gaps between the respective portions of said lateral layer material which constitute said projection and said two lateral layers,
 - growth of lateral layers surrounding said laser stripe by a non-selective growth method whereby said lateral layer material is grown not only in said valleys for forming said lateral layers but also on said protection stripe to form a parasitic projection above said mesa, the refractive indices, types of electrical conductivity and resistivity of said active and lateral confinement layers being selected in parts at least of said layers to establish optical confinement in said laser stripe and so that the passage of a current between said confinement layers is localized through said laser stripe and enables light amplification to take place therein,
 - a projection removal step carried out using a lift-off attacking medium whereby said medium passes through said gaps to eliminate said lift-off stripe by selectively attacking said lift-off material in order to separate said parasitic projection from said first upper confinement stripe, and
 - formation of electrical connection means for said current.

The implementation of the present invention is described hereinafter by way of non-limiting example only with reference to the appended diagrammatic drawing. Where the same item is shown in more than one figure it is always identified by the same reference symbol. Where a layer is identified by a reference number, a portion of this layer is designated by the same reference number with the suffix A.

DETAILED DESCRIPTION OF THE INVENTION

Figure 1A:
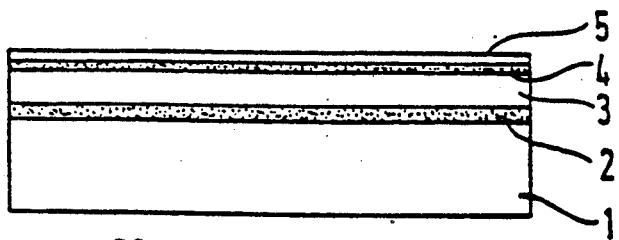
FIGS. 1A through 1G are views in cross-section of a semiconductor substrate after successive steps of the method in accordance with the invention of manufacturing a planar buried heterojunction laser.

The first step of the method in accordance with the present invention is to form a lower confinement layer 1 of a semiconductor base material having a first type of conductivity. It then comprises the following stages:
- Growth of an active layer 2 of an active material.
- Growth of a first upper confinement layer 3 of said base material having the second type of conductivity.
- Etching to define the boundaries of said laser stripe by locally eliminating at least the active layer and the first upper confinement layer by etching two valleys 20 one on each side of a laser stripe 2A constituted by a remaining portion of said active layer. Said stripe and the layers on top of it form an upstanding mesa 22 which is linked by two flanks 24 to said two valleys.

- Growth of lateral layers 6, 7 surrounding said laser stripe.

The refractive indices, types of electrical conductivity and resistivity of these active and lateral confinement layers are selected in parts at least of said layers to establish optical confinement in said laser stripe and so that the passage of an electric current between said confinement layers is localized through said laser stripe and injects thereinto charge carriers enabling amplification of light to be emitted by the laser.

- A subsequent step is the formation of electrical connection means 30, 32, 34 for said current.

A general description will now be given of the procedures relating to the use of non-selective growth methods:

Two growth steps are carried out after said step of growing a first upper confinement layer and before said stripe boundary definition etching step:

- growth of a lift-off layer 4 of a lift-off material that can be selectively chemically attacked, and
- growth of a protective layer 5 on said lift-off layer (FIG. 1A).

Figure 1B:
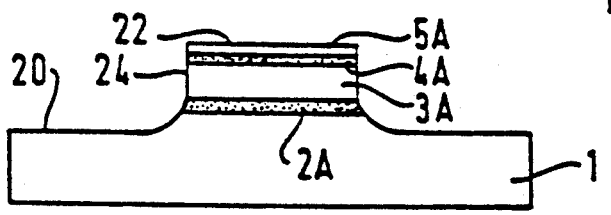

The subsequent laser stripe boundary definition etching step eliminates said lift-off and protection layers at both sides of the laser stripe 2A while allowing them to remain above said stripe in the form of lift-off and protection stripes 4A and 5A which form the upper part of the mesa 22 above said stripe. Said mesa also includes an upper confinement stripe 3A consisting of the remaining portion of the first upper confinement layer 3 (FIG. 1B).

Figure 1C:
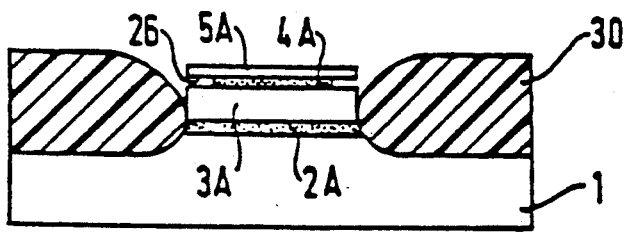
Figure 1D:
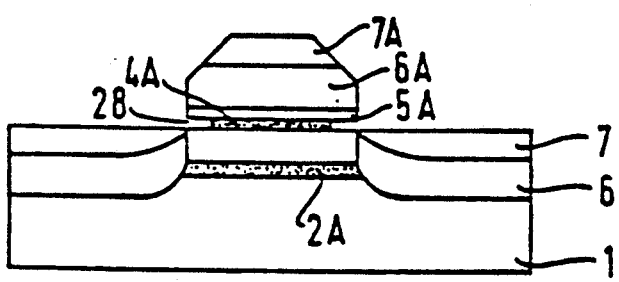

The lateral layer growth step is then carried out using a non-selective growth method whereby said lateral layer material is grown not only in the valleys 20 to form the lateral layers 6 and 7 but also on the protection stripe 5A to form a parasitic projection 6A, 7A above the mesa 22 (FIG. 1D).

The method further comprises a sub-etching step carried out after the laser stripe boundary definition etching step and before the lateral layer growth step. Said sub-etching step is carried out using a lift-off attacking medium which selectively attacks said lift-off material to eliminate two lateral portions of the lift-off stripe 4A. It therefore forms a hollow 26 (FIG. 1C) under each edge of the parasitic projection 6A, 7A whereby the subsequent lateral layer growth step causes the appearance of two gaps 28 between the respective portions of the lateral layer material which constitute said projection 6A, 7A and said two lateral layers 6 and 7. These gaps form passages open from the exterior to the edges of the lift-off stripe 4A (FIG. 2D) which are used in a subsequent process step.

The method further comprises, after said lateral layer growth step and before said electrical connection means formation step, a projection removal step which is carried out using said lift-off attacking medium. In this step this medium passes through the passages 28 to the edges of the lift-off stripe 4A and further eliminates this stripe to separate the parasitic projection 6A, 7A from the first upper confinement stripe 3A. This separation enables subsequent removal of this projection.

The present invention applies in particular to the situation in which the active material 2 is sensitive to said lift-off attacking medium. In this case the method comprises, after the stripe boundary definition etching step and before the sub-etching step, a stripe protection step for protecting the edges of the laser stripe 2A. The stripe protection step preferably comprises the following steps:

- deposition of a layer of resin 30 on the valleys 20, the mesa 22 and its flanks 24 to protect against said lift-off attacking medium, and
- careful removal of said resin whereby it is only allowed to remain in said valleys and on a lower part of said flanks comprising the edges of said laser stripe.

This resin removal step is preferably localized on the mesa 22 and in the region thereof. It is followed by a step in which sufficient fluidity is imparted to the protective resin 30 for its surface tension forces to cause it to migrate towards said mesa with an increase in and evening out of its height along the flanks 24 of the mesa. This resin flow step is achieved by heating, for example.

These various provisions apply advantageously in the following case: said base and lateral materials have a binary intrinsic composition and in particular comprise indium phosphide or gallium arsenide appropriately doped to constitute the layers previously indicated. The active and lift-off materials have a ternary and/or quaternary intrinsic composition further including gallium, aluminum and/or arsenic.

The chronological succession of the steps previously referred to will now be described in the specific context of one embodiment of the present invention.

FIG. 1A shows the result of a first growth stage. On an n-doped InP semiconductor substrate constituting the lower confinement layer 1 various operations are carried out during which the following layers are deposited in succession:

- The 100 to 300 nm thick active layer 2 of GaInAsP, for example. This layer will form the double heterostructure of the laser.
- The 800 nm thick first upper confinement layer 3 of p-doped InP material, for example.
- The lift-off layer 4 adapted to enable the removal method known internationally as the "lift-off" method. The lift-off material of this layer is an indium and gallium arsenide InGaAs, for example, approximately 300 nm thick.
- The 300 nm thick protection layer 5 of InP material protecting the layer 4.

The etching step then delimits the laser stripe 2A. It simultaneously forms the mesa 22 which is 100 to 300 nm wide, for example (FIG. 1B). Conventional etching techniques are used.

The laser stripe protection step is then carried out. For this purpose a protective resin is deposited and carefully removed in an area including the mesa. After a step in which this resin is caused to flow, it assumes the form shown in FIG. 1C and constitutes protection for the edges of the laser stripe 2A whilst leaving exposed the edges of the lift-off stripe 4A.

A known composition lift-off attacking medium selective chemical attack step constitutes the stripe 4A sub-etching step (for example $H_2SO_4$, $H_2O_2$, $H_2O$ in proportions by volume of 1-1 and 20, respectively, at ambient temperature, for 20 s). The result is shown in FIG. 1C.

The respectively p-doped and n-doped lateral layers 6 and 7 are then grown to bury the laser stripe 2A. The material of these layers is indium phosphide InP. The growth method used is non-selective. It may be the molecular jet epitaxy (MJE) method or the metalorganic chemical vapor deposition (MOCVD) method operated at atmospheric pressure. This non-selective method grows a projection in the form of stripes 6A and 7A on the mesa 22, in other words on the stripe 5A. The sub-etching step introduces a discontinuity of the lateral layer material between this projection and these lateral layers which forms the previously mentioned gaps 28. Note that the layers 6 and 7 may be replaced with a succession of layers comprising a layer of iron-doped semi-insulative InP.

Figure 1E:
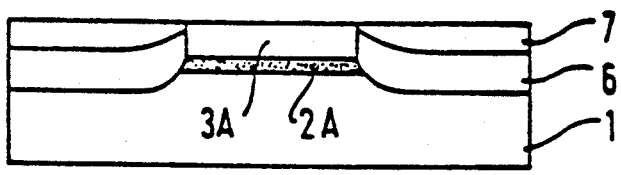
Figure 1F:
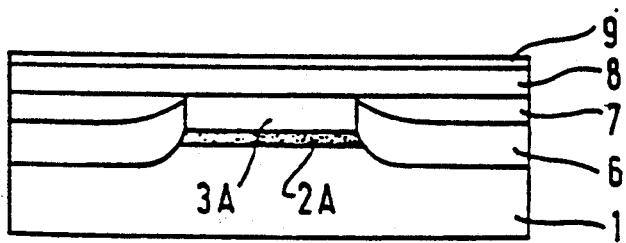
Figure 1G:
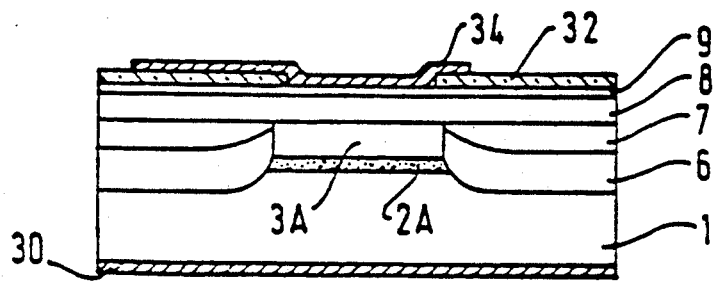

During the lift-off step, selective attack of the stripe 4A using the same attacking medium for a longer period than previously eliminates this stripe which enables the projection 6A, 7A to be removed (FIG. 1E).

A growth step then deposits a second upper confinement layer 8 and a contact layer 9. This completes the semiconductor structure of the planar buried heterojunction laser.

The finished laser component is obtained by conventional technological processes including the deposition and etching of a dielectric layer 32 and the deposition of electrodes 30 and 34 to provide electrical connection means.

The invention is not limited to the laser described above by way of example only which emits at a wavelength of 1.5 microns.

There is claimed:

1. Method of manufacturing a planar buried heterojunction laser including a stage in which is formed a lower confinement layer consisting of a semiconductor base material having a first type of conductivity,
   - the method comprising subsequent other steps including layer growing steps for epitaxial deposition of semiconductor layers on underlying layers, said other steps including:
   - growth of an active layer of an active material,
   - growth of a first upper confinement layer of said base material having the second type of conductivity,
   - growth of a lift-off layer of a lift-off material that can be selectively attacked by chemical means,
   - growth of a protective layer on said lift-off layer whereby subsequent laser stripe boundary definition etching eliminates said protection layer at both sides of said laser stripe while allowing it to remain above said stripe in the form of a protective stripe for forming said mesa above said stripe,
   - etching to define the boundaries of said laser stripe by locally eliminating at least said active layer, said first upper confinement layer and said lift-off layer by etching two valleys one on each side of an upstanding mesa joined by two flanks to said valleys, said mesa comprising a laser stripe, an upper confinement layer and a lift-off layer consisting of the remaining portions of said active layer, said first upper confinement layer and said lift-off layer, respectively,
   - a sub-etching step carried out using a lift-off attacking medium to eliminate two lateral zones of said lift-off stripe and form a hollow under each edge of said parasitic projection whereby a subsequent lateral layer growth step causes the appearance of two gaps between the respective portions of said lateral layer material which constitute said projection and said two lateral layers,
   - growth of lateral layers surrounding said laser stripe by a non-selective growth method whereby said lateral layer material is grown not only in said valleys for forming said lateral layers but also on said protection stripe to form a parasitic projection above said mesa, the refractive indices, types of electrical conductivity and resistivity of said active and lateral confinement layers being selected in parts at least of said layers to establish optical confinement in said laser stripe and so that the passage of a current between said confinement layers is localized through said laser stripe and enables light amplification to take place therein,
   - a projection removal step carried out using a lift-off attacking medium whereby said medium passes through said gaps to eliminate said lift-off stripe by selectively attacking said lift-off material in order to separate said parasitic projection from said first upper confinement stripe, and
   - formation of electrical connection means for said current.

2. Method according to claim 1 wherein said active material is sensitive to said lift-off attacking medium and comprising after said stripe boundary definition etching step and prior to said sub-etching step a laser stripe protection step for protecting the edges of said laser stripe.

3. Method according to claim 2 wherein said laser stripe protection step includes:
   - deposition of a layer of resin constituting protection against said lift-off attacking medium on said valleys, said mesa and said flanks thereof, and
   - careful removal of said resin whereby it is only allowed to remain in said valleys and on a lower part of said flanks comprising the edges of said laser stripe.

4. Method according to claim 3 wherein said resin removal step is localized on said mesa and in the region thereof and is followed by a step in which sufficient fluidity is imparted to said protective resin for its surface tension forces to cause it to migrate towards said mesa with an increase in and evening out of its height along said portions of the mesa.

5. Method according to claim 1 wherein said base material and said lateral layer material are the same material with a binary intrinsic composition and said active material and said lift-off material are ternary and/or quaternary intrinsic compositions.

6. Method according to claim 5 wherein said base material and said lateral layer material are indium phosphide or gallium arsenide and said active material and said lift-off material further include gallium, aluminum and/or arsenic.

* * * * *